(12) United States Patent
Valk (10) Patent No.: US 12,211,916 B2
(45) Date of Patent: Jan. 28, 2025

(54) FIELD-EFFECT TRANSISTOR HAVING IMPROVED LAYOUT

(71) Applicant: Ampleon Netherlands B.V., Nijmegen (NL)

(72) Inventor: Patrick Valk, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 396 days.

(21) Appl. No.: 17/755,029

(22) PCT Filed: Oct. 30, 2020

(86) PCT No.: PCT/NL2020/050675
§ 371 (c)(1),
(2) Date: Apr. 19, 2022

(87) PCT Pub. No.: WO2021/086189
PCT Pub. Date: May 6, 2021

(65) Prior Publication Data
US 2022/0393010 A1    Dec. 8, 2022

(30) Foreign Application Priority Data
Oct. 31, 2019   (NL) .................................... 2024135

(51) Int. Cl.
  *H01L 29/423*  (2006.01)
  *H01L 23/482*  (2006.01)
  (Continued)

(52) U.S. Cl.
  CPC ...... *H01L 29/4238* (2013.01); *H01L 23/4824* (2013.01); *H01L 29/0852* (2013.01);
  (Continued)

(58) Field of Classification Search
  CPC .......... H01L 23/4824; H01L 29/41758; H01L 29/4238
  See application file for complete search history.

(56) References Cited

U.S. PATENT DOCUMENTS 6,081,006 A    6/2000 Nelson
9,577,056 B2 *  2/2017 Reiner .............. H01L 29/41758
(Continued)

OTHER PUBLICATIONS

PCT International Search Report and Written Opinion, Application No. PCT/NL2020/050675, mailed Feb. 4, 2021, 12 pages.

*Primary Examiner* — Alia Sabur
(74) *Attorney, Agent, or Firm* — McDonnell Boehnen Hulbert & Berghoff LLP (57) ABSTRACT

Example embodiments relate to a field-effect transistors having improved layouts. One example field-effect transistor includes a semiconductor substrate on which at least one transistor cell array is arranged. Each transistor cell includes a first transistor cell unit. Each first transistor cell unit includes a plurality of gate fingers, a main gate finger segment, a plurality of drain fingers, and a main drain finger segment. Each first transistor cell unit also includes a main gate finger base connected to the main gate finger segment of the first transistor cell unit and extending from that main gate finger segment towards the main drain finger segment of that first transistor cell unit. Further, each first transistor cell unit includes a main drain finger base connected to the main drain finger segment of that first transistor cell and extending from that main drain finger segment towards that main gate finger segment.

20 Claims, 5 Drawing Sheets

(51) Int. Cl.
*H01L 29/08* (2006.01)
*H01L 29/417* (2006.01)
*H01L 29/778* (2006.01)
*H01L 29/78* (2006.01)

(52) U.S. Cl.
CPC ...... *H01L 29/41758* (2013.01); *H01L 29/778* (2013.01); *H01L 29/7816* (2013.01)

(56) References Cited

U.S. PATENT DOCUMENTS

| | | | |
|---|---|---|---|
| 2015/0243743 A1* | 8/2015 | Reiner | H01L 27/088 257/773 |
| 2018/0190777 A1 | 7/2018 | Tomomatsu et al. | |
| 2020/0075479 A1* | 3/2020 | Khalil | H01L 21/76802 |
| 2020/0343352 A1* | 10/2020 | Trang | H01L 24/05 |

\* cited by examiner

FIELD-EFFECT TRANSISTOR HAVING IMPROVED LAYOUT

CROSS-REFERENCE TO RELATED APPLICATIONS

The present application is a national stage entry of PCT/NL2020/050675 filed Oct. 30, 2020, which claims priority to NL 2024135 filed Oct. 31, 2019, the contents of each of which are hereby incorporated by reference.

The present invention relates to a field-effect transistor, to a package field-effect transistor and to an electronic device comprising the same. More in particular, the present invention relates to a field-effect transistor having an improved layout of the gate and drain fingers.

Figure 1A:
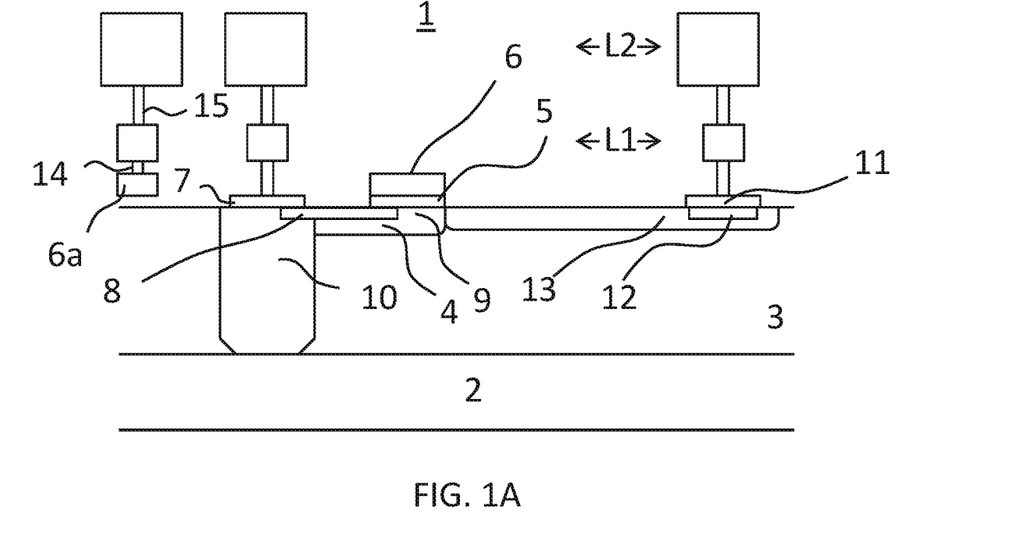
FIGS. 1A and 1B illustrate a cross section of a known LDMOS transistor and a top view of a gate contact thereof.

FIG. 1A illustrates a cross-section of a known laterally diffused metal-oxide semiconductor 'LDMOS' transistor 1. This transistor comprises a conductive semiconductor substrate 2 such as a p-type Silicon substrate. Typically, a lower doped p-type Si epitaxial layer 3 forms the upper part of semiconductor substrate 2. A p-type well 4 is formed underneath gate oxide 5, which oxide is covered by a poly-Si gate contact 6. Source contact 7, which may be formed using a suitable metal composition or alloy such as poly-Si, contacts a highly doped n-type contact region 8. This region extends to under gate oxide 5. The region directly under gate oxide 5 and adjacent to contact region 8 is referred to as the channel region 9. Furthermore, a highly doped p-type sinker 10 is provided to isolate adjacent transistors. Typically, the source of transistor 1 is grounded via sinker 10 that connects to substrate 2. More in particular, source contact 7 is electrically connected to contact region 8 and sinker 10.

A drain contact 11 is provided on the opposite side of gate oxide 5. To this end, a highly doped n-type contact region 12 is provided. An n-type drift region 13 is arranged in between channel region 9 and drain contact region 12. Drift region 13 allows for field-effect transistor 1 to operate at relatively high voltages.

A metal layer stack is typically employed to provide access to field-effect transistor 1. FIG. 1A illustrates an example of two metal layers L1, L2 that are separated by a dielectric material. Vias through the dielectric material are used to make contact between the metal layers and between the metal layers and the gate, drain, and source contacts.

Electrical current is preferably transported through metal layers L1, L2 as the thickness of these layers and/or the conductivity of these layers is greater than that of the gate, drain, and source contacts to which they are connected.

Figure 1B:
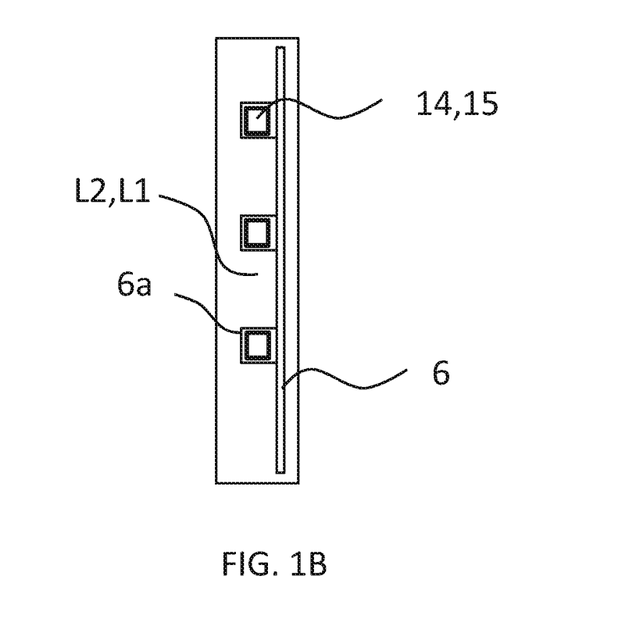

FIG. 1B, providing a partial top view of gate contact 6, illustrates that gate contact 6 has an elongated shape. At preferably regular intervals, gate islands 6a are formed. These islands are used to allow a connection to be made between gate contact 6 and metal tracks on metal layers L1, L2. The width of gate contact 6 is typically in the order of a micrometer (not shown true to scale in FIG. 1B), whereas the minimum width of a via is in the order of 50-100 micrometer. The relatively large size of gate islands 6a allows a connection between gate contact 6 and metal layer L1 to be made using a via 14. At the same or different position, a connection between metal layer L1 and metal layer L2 can be made using a via 15. It is further noted that the elongated structures in metal layers L1, L2, which have thicknesses in the order of micrometers, are not shown true to scale relative to the gate, drain, and source contacts. Also other parts of field-effect transistor 1 are not illustrated true to scale to allow all components to be visualized in the same figure.

The metal structures on metal layers L1, L2 that are connected to gate contact 6 also have an elongated shape and are often referred to as gate runner. Drain contact 11 and source contact 7 are also connected to structures on metal layers L1, L2. These metal structures also have an elongated shape. As shown in FIG. 1, the metal structures connected to source contact 7 are typically arranged in between the gate runner and the metal structures connected to drain contact 11. In this manner, an improved isolation between the gate and drain of field-effect transistor 1 can be obtained.

As both gate contact 6 and the corresponding gate runner have an elongated shape, they will hereinafter be referred to, both individually and jointly, as gate finger. Similar considerations hold for the drain contacts and corresponding metal structures on layers L1, L2, which will hereinafter be referred to, both individually and jointly, as drain finger.

Figure 2A:
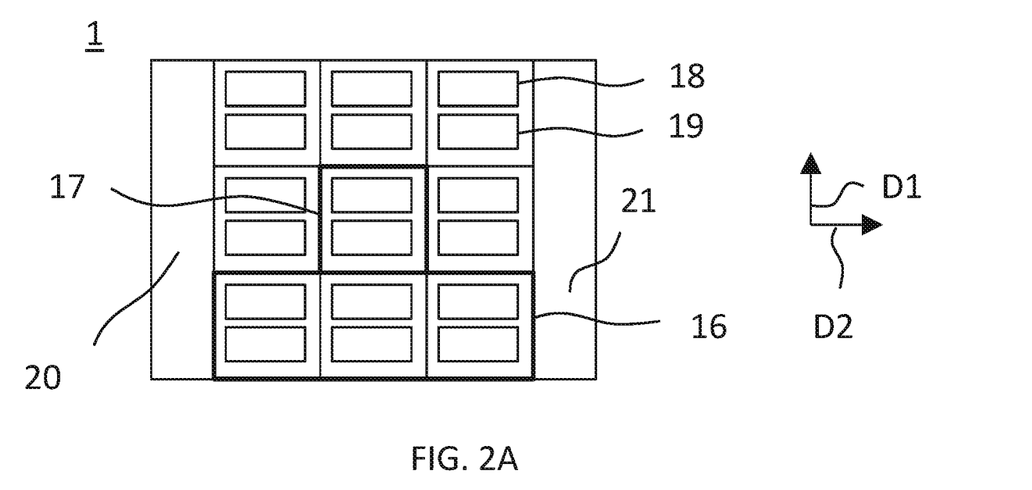
FIGS. 2A and 2B illustrate a known arrangement of a field-effect transistor and a known implementation of this arrangement.

FIG. 2A illustrates a known arrangement for field-effect transistor 1. Here, field-effect transistor 1 comprises three transistor cell arrays 16, each transistor cell array 16 comprising three adjacently arranged interconnected transistor cells 17. Each transistor cell 17 comprises a first transistor cell unit 18 and optionally a second transistor cell unit 19. Typically, second transistor cell unit 19 is generally a mirrored copy of first transistor cell unit 18.

Field-effect transistor 1 further comprises a gate bar 20 for receiving a signal to be amplifier or otherwise processed, and a drain bar 21 for outputting the amplified or processed signal. As shown, gate bar 20 and drain bar 21 each extend in a first direction D1 and are spaced apart in a second direction D2.

Figure 2B:
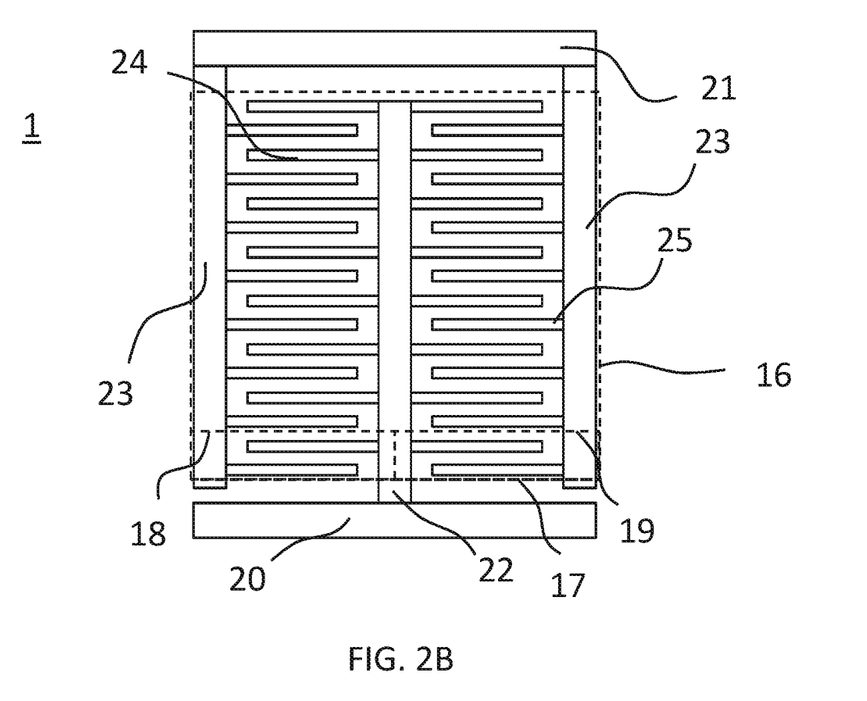

FIG. 2B illustrates a known implementation of the arrangement of FIG. 2A. In this arrangement, field-effect transistor 1 comprises a single transistor cell array 16 comprising eight transistor cells 17, each transistor cell 17 comprising a first transistor cell unit 18 and second transistor cell unit 19. From gate bar 20, a main gate finger 22 extends towards drain bar 21. Similarly, from drain bar 21, two main drain fingers 23 extend towards gate bar 20. Main gate finger 22 is connected to a plurality of gate fingers 24 and main drain fingers 23 are connected to a plurality of drain fingers 25.

In FIG. 2B, each transistor cell unit 18, 19 comprises a single gate finger 24 and a single drain finger 25. In other transistor cell units, multiple gate fingers and multiple drain fingers may be used.

The gate and drain fingers correspond to a respective active area of field-effect transistor 1 for the purpose of forming a transistor unit. The combined effect of all transistor units defines the electrical behavior of field-effect transistor 1.

Second transistor cell unit 19 is a mirrored copy of first transistor cell unit 18. It is further noted that main gate finger 22 can be split into a number of interconnected main gate finger segments, wherein each segment is comprised in a respective transistor cell unit 18, 19 and wherein an outer segment is connected to gate bar 20. Similar considerations hold for main drain fingers 23.

To characterize the performance of a field-effect transistor several figures of merit can be used. An important figure of merit is the large-signal gain at radiofrequency 'RF' frequencies, hereinafter referred to as the gain. Transistors having a high gain are capable of efficiently amplifying RF signals. When the gain of a transistor is low, the overall efficiency of the amplifier in which the transistor is incorporated will deteriorate.

For high power field-effect transistors, a high total gate length, i.e. the number of fingers times the gate length of a single finger, must be used to supply the required power. A high total gate width can be achieved by using many relatively long fingers in parallel.

An acceptable gate length for RF transistors is commonly considered to be 600-700 µm. Fingers longer than 1 mm or even 2 mm are sometimes used only in high power transistors for frequencies below 1 GHz. Fingers longer than 3 mm are not used due to instability issues.

Arranging many fingers in parallel is not without risk as placing fingers very close to each other induces thermal issues as the respective transistor units and associated fingers and contacts are not only heated by their own current consumption, but also by current consumption in neighboring transistor units. Consequently, sufficient distance between transistor units, and therefore between gate fingers, should exist to ensure reliable operation.

A continuing demand exists for increasing the power density that can be realized using field-effect transistors. This power density is determined by the semiconductor technology used, e.g. GaN FET or Si LDMOS, and by the layout of the field-effect transistor itself.

A field-effect transistor is known from U.S. Pat. No. 6,081,006A. A further field-effect transistor is known from US 2018/190777A1.

According to the invention, a field-effect transistor in accordance with claim 1 is provided that has an improved power density by using a different layout of the field-effect transistor. This field-effect transistor is characterized in that each first transistor cell unit further comprises a main gate finger base connected to the main gate finger segment of that first transistor cell unit and extending from that main gate finger segment towards the main drain finger segment of that first transistor cell unit, wherein the main gate finger base is connected to the one or more gate fingers. Similarly, each first transistor cell unit comprises a main drain finger base connected to the main drain finger segment of that first transistor cell unit and extending from that main drain finger segment towards the main gate finger segment of that first transistor cell unit, wherein the drain gate finger base is connected to the one or more drain fingers.

According to the present invention, the one or more gate fingers and the main gate finger segment for each first transistor cell unit extend in a same direction, and the one or more drain fingers and the main drain finger segment for each first transistor cell unit extend in a direction opposite to this same direction. Additionally, substantially all gate fingers that are electrically connected to the gate bar extend in the aforementioned same direction away from the main gate finger bases they are connected to, and substantially all drain fingers that are electrically connected to the drain bar extend in the direction opposite to the same direction away from the main drain finger bases they are connected to.

Within the context of the present invention, a component, such as gate or drain finger, can be said to extend away from another component in a given direction if a vector, starting from a point at a side of the component at which it is connected to the another component and ending at a point on the opposite side of the component, points in the same direction as said given direction. For example, a gate finger extending from a main gate finger base in a direction from left to right corresponds to a gate finger that is arranged on the right hand side of the main gate finger base, whereas a gate finger extending from a main gate finger base in a direction from right to left, i.e. opposite to the direction from left to right, corresponds to a gate finger that is arranged on the left hand side of the main gate finger base.

The Applicant has found that by arranging the gate fingers and the drain fingers in the manner described above, an improved gain can be obtained. An explanation for the improvement will be discussed next by referring to FIG. 3. In this figure, a first transistor cell unit 100 is shown in which a main gate finger segment 101 is connected to two gate fingers 102 via main gate finger base 103. Similarly, main drain finger segment 104 is connected to two drain fingers 105 via main drain finger base 106. Together with two active areas 107A, 107B, two transistor units are formed.

Figure 3:
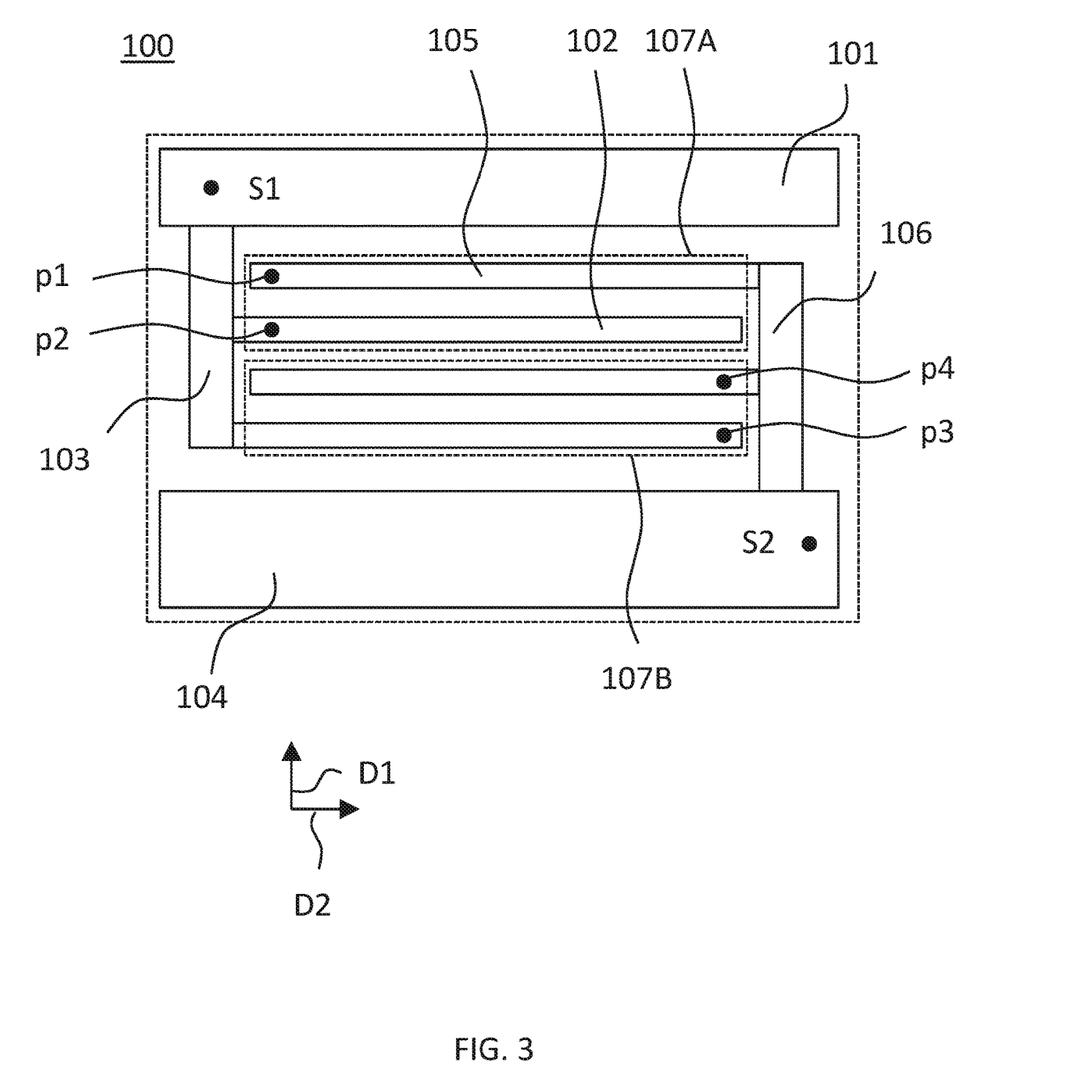
FIG. 3 illustrates a transistor cell unit in accordance with the present invention.

During operation, a gate signal will be provided, via the gate bar, to main gate finger segment 101. For example, a gate signal will be present at a point S1. This signal will propagate through main gate finger base 103 and gate fingers 102. At RF frequencies, a non-negligible phase delay will exist between the signals at point p2 and point p3. More in particular, the signal at point p3 will lag behind the signal at point p2. Hence, locally, the drain signal at points p1 and p4 will be controlled by the gate signal at different phases thereof. For example, the control of the drain current at point p4 will lag behind the control of the drain current at point p1. However, due to the arrangement of gate fingers 102 and drain fingers 105, the drain currents will add substantially in phase at point S2. More in particular, the delay in time of controlling the drain current at point p4 is substantially compensated by the smaller delay of the drain current between point S2 and p4 compared to the delay between point S2 and point p1. As the drain currents add in phase at point S2, the field-effect transistor will display an increased gain. Consequently, a higher output power can be achieved for the same amount of current consumption. Put differently, the field-effect of the present invention allows for an increased power density.

The skilled person will readily understand that the advantageous behavior described above will also be achieved if only a few gate fingers and/or a few drain fingers are not arranged in the manner described above but the remaining gate and drain fingers are. According to the present invention substantially all gate fingers that are electrically connected to the gate bar should be arranged in the manner described above. The same holds for the drain fingers that are electrically connected to the drain bar. Here, it is noted that a gate finger is electrically connected to the gate bar via the main gate finger base and the main gate finger and a drain finger is electrically connected to the drain bar via the main drain finger base and the main drain finger.

The newly proposed arrangement of gate fingers and drain fingers in accordance with the invention enables sizing of RF FET architectures allowing more active area on a single chip layout, enabling an increase in die size and an increase in the total output power per chip.

Preferably, more than 75 percent of the gate fingers that are electrically connected to the gate bar extend in said same direction, more preferably more than 90 percent, and most preferably all gate fingers. Furthermore, preferably more than 75 percent of the drain fingers that are electrically connected to the drain bar extend in the direction opposite to the same direction, more preferably more than 90 percent, and most preferably all drain fingers.

The gate bar may extend in a first direction and the drain bar may be spaced apart from the gate bar in a second direction perpendicular to the first direction and may extend in the first direction. Additionally or alternatively, each transistor cell array of the at least one transistor cell array can be arranged in between the gate bar and the drain bar.

The abovementioned same direction may correspond to the second direction. Moreover, the main drain finger segment and the main gate finger segment for each first transistor cell unit can be spaced apart in the first direction. In this case, and for each first transistor cell unit, the main gate finger base may extend in a direction opposite to the second direction from the main gate finger segment towards the main drain finger segment, while the main drain finger base extends in the second direction from the main drain finger segment towards the main gate finger segment. Alternatively, for each first transistor cell unit, the main gate finger base may extend in the second direction from the main gate finger segment towards the main drain finger segment, while the main drain finger base extends in a direction opposite to the second direction from the main drain finger segment towards the main gate finger segment.

The transistor cell may comprise a second transistor cell unit, wherein the second transistor cell unit is a copy of the first transistor cell unit mirrored along the main gate finger segment of the first transistor cell unit, wherein the first and second transistor cell units are adjacently arranged in the first direction and share the main gate finger segment. Alternatively, the transistor cell may comprise a second transistor cell unit that is a copy of the first transistor cell unit mirrored along the main drain finger segment of the first transistor cell unit, wherein the first and second transistor cell units are adjacently arranged in the first direction and share the main drain finger segment.

The field-effect transistor can be easily scaled by having it comprising a plurality of the aforementioned transistor cell arrays arranged spaced apart from each other in the first direction. In this case, the field-effect transistor may comprise at least one pair of transistor cell arrays in the plurality of transistor cell arrays that share main input finger segments or main output finger segments.

To reduce the feedback capacitance of the field-effect transistor, one or more transistor cell arrays of the at least one transistor cell array may comprise at least one first grounded shield arranged on the semiconductor substrate that is associated with a pair of adjacently arranged first transistor cell units and that is arranged in between the main drain finger base of one first transistor cell unit and the main gate finger base of the other first transistor cell unit. Additionally or alternatively, one or more transistor cell arrays of the at least one transistor cell array may comprise at least one second grounded shield arranged on the semiconductor substrate that is associated with a pair of adjacently arranged second transistor cell units and that is arranged in between the main drain finger base of one second transistor cell unit and the main gate finger base of the other second transistor cell unit.

To reduce the feedback capacitance of the field-effect transistor, the field-effect transistor may further comprise, for one or more transistor cell arrays of the at least one transistor cell array, at least one third grounded shield arranged on the semiconductor substrate between the drain bar and the main gate finger segment of the first transistor cell unit of a transistor cell in said one or more transistor cell arrays directly adjacent the drain bar and/or at least one fourth grounded shield arranged on the semiconductor substrate between the gate bar and the main drain finger segment of the first transistor cell unit of a transistor cell in said one or more transistor cell arrays directly adjacent the gate bar. The field-effect transistor may additionally or alternatively comprise, for one or more transistor cell arrays of the at least one transistor cell array, at least one fifth grounded shield arranged on the semiconductor substrate between the drain bar and the main gate finger segment of the second transistor cell unit of a transistor cell in said one or more transistor cell arrays directly adjacent the drain bar and/or at least one sixth grounded shield arranged on the semiconductor substrate between the gate bar and the main drain finger segment of the second transistor cell unit of a transistor cell in said one or more transistor cell arrays directly adjacent the gate bar.

Each first transistor cell unit, and each second transistor cell unit when applicable, may comprise one or more respective source fingers that extend in parallel to the one or more gate fingers in the first transistor cell unit or second transistor cell unit, respectively. Each source finger can be associated with a gate finger and a drain finger for the purpose of forming a transistor unit. Moreover, the source finger may extend in between the gate finger and drain finger it is associated with.

The main gate finger segment, the main drain finger segment, the main gate finger base, the main drain finger base, the one or more gate fingers, the one or more drain fingers, optionally the one or more source fingers of each first transistor cell unit and/or second transistor cell unit, and optionally the first to sixth grounded shields can be each formed using one or more metals of a same metal layer stack.

The transistor can be a laterally diffused metal-oxide-semiconductor transistor 'LDMOS', preferably a Silicon based LDMOS, or the transistor can be a high electron mobility transistor 'HEMT', preferably a Gallium Nitride based HEMT. However, other transistor technologies are not included. For example, the present invention can equally be applied to bipolar transistors. In general, a transistor has an input and an output respectively corresponding to the aforementioned gate and drain of the field-effect transistor described above. Accordingly, the invention can be applied to any transistor technology provided that in the description above, the wording 'gate' is replaced by input and the wording 'drain' by output.

A combined length of all the gate fingers may exceed 1 mm, and/or a combined length of all the drain fingers may exceed 1 mm, and/or an operational frequency of the transistor may exceed 500 MHz.

According to a second aspect, the present invention provides a packaged transistor, comprising a conductive substrate, and the field-effect transistor as defined above mounted on the conductive substrate. The packaged transistor further comprises a gate lead and a drain lead, both isolated from the conductive substrate by a dielectric separator. Additionally, the packaged transistor comprises one or more gate bondwires connecting the gate bar of the field-effect transistor either directly or indirectly to the gate bar, and one or more drain bondwires connecting the drain bar of the field-effect transistor either directly or indirectly to the drain bar.

According to a third aspect, the present invention provides an electronic device comprising the field-effect transistor or the packaged field-effect transistor as defined above. This device is preferably a base station for mobile telecommunications, a radar, or a solid state cooking device.

Next, the present invention will be described in more detail referring to the appended drawings, wherein.

Figure 4A:
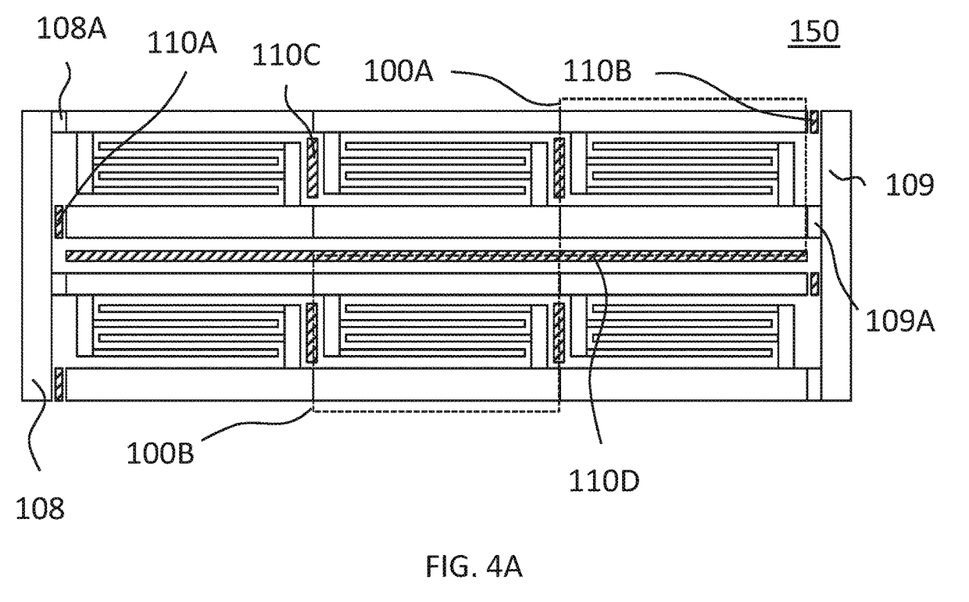
FIGS. 4A-4C illustrate three different arrangements of a field-effect transistor according to the present invention in which the transistor cell of FIG. 3 is incorporated.

FIG. 4A illustrates a first arrangement of a field-effect transistor 150 according to the present invention in which the transistor cell of FIG. 3 is incorporated. Transistor 150 comprises a transistor cell array comprising three transistor cells, wherein each transistor cell comprises a first transistor cell unit 100A and a second transistor cell unit 100B. The main gate finger segments of first transistor cell units 100A are electrically connected. Moreover, on the left hand side, a connection is made between the main gate finger segment of the outer left first transistor cell unit 100A and gate bar 108 using connecting block 108A. Similarly, the main drain finger segments of first transistor cell units 100A are electrically connected. Moreover, on the right hand side, a connection is made between the main drain finger segment of the outer right first transistor cell unit 100A and drain bar 109 using connecting block 109A.

Isolating shields, illustrated as hashed rectangles, are provided to isolate the gate and the drain of transistor 150. For example, a shield 110A is provided in between gate bar 108 and the main drain finger segment of the outer left first transistor unit 100A. A shield 110B is also provided in between drain bar 109 and the main gate finger segment of the outer right first transistor unit 100A.

Shields 110C are also provided in between the main gate finger base of a first transistor cell unit 100A and the main drain finger base of an adjacently arranged first transistor cell unit 100A. Finally, a shield 110D is also provided in between the main drain finger segments of the first transistor cell units 100A and the main gate finger segments of the second transistor cell units 100B. It should be noted that shields can, as illustrated, be provided for second transistor cell units 100B in a similar manner as for first transistor cell units 100A. Furthermore, in each case, shields 110A-100D can be realized using grounded metal structures in the upper layers of the metal layer stack.

FIG. 4A illustrates that second transistor cell units 100B are a copy of first transistor cell units 100A. However, in FIG. 4B, second transistor cell units 100B are copies of first transistor cell units 100A that are mirrored along a line through the main gate finger segments of first transistor cell units 100A. Moreover, the main gate finger segments of first and second transistor cell units 100A, 100B are shared. In FIG. 4C, second transistor cell units 100B are copies of first transistor cell units 100A that are mirrored along a line through the main drain finger segments of first transistor cell units 100A. Moreover, the main drain finger segments of first and second transistor cell units 100A, 100B are shared.

Figure 4B:
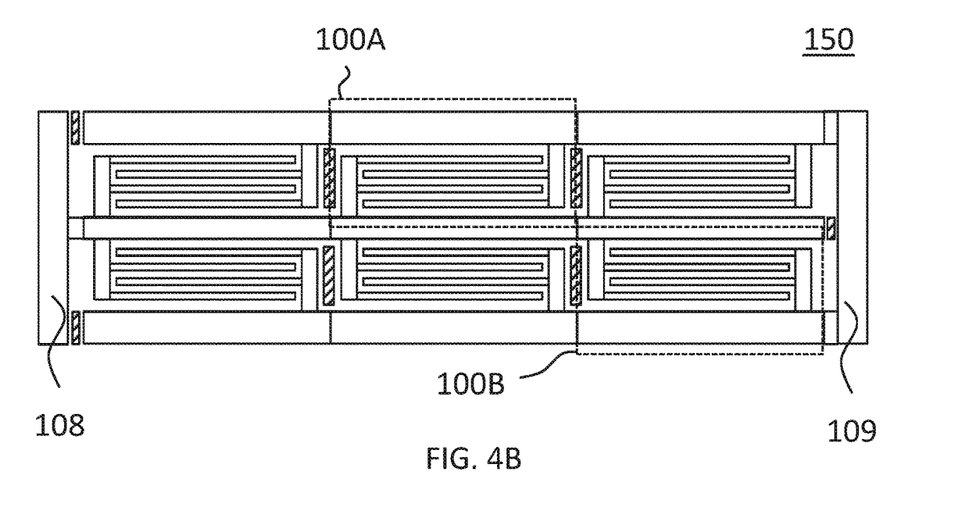
Figure 4C:
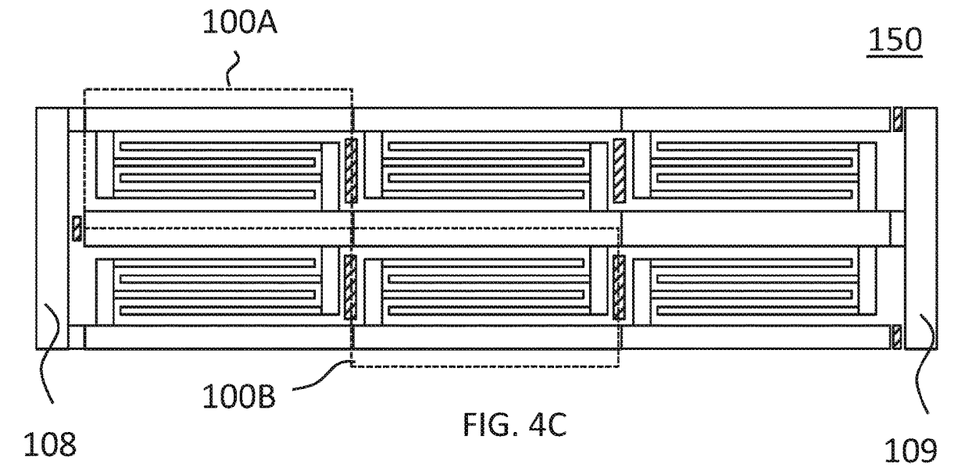

It can be easily be verified that for each of the arrangements in FIGS. 4A-4C, phase delays between signals is minimized and/or avoided as explained in conjunction with FIG. 3.

Figure 5:
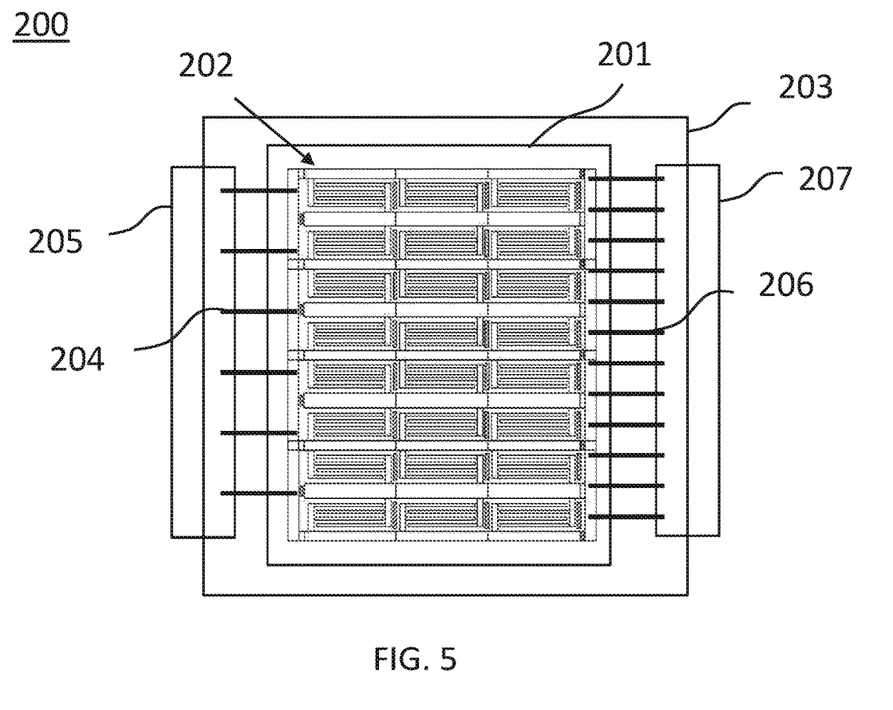
FIG. 5 illustrates a packaged transistor in accordance with the present invention.

FIG. 5 illustrates a packaged transistor 200 in accordance with the present invention. The packaged transistor 200 shown in FIG. 5 comprises a semiconductor die 201 on which a field-effect transistor 202, such as a field-effect transistor having the arrangement as shown in FIGS. 4A-4C, is realized. Semiconductor die 201 is mounted on a conducting substrate 203, such as a copper or copper-based flange. Connection between field-effect transistor 202 and the outside world is achieved using bondwires 204 that make a connection between the gate of field-effect transistor 202 and an input lead 205. Similarly, bondwires 206 are used to make a connection between the drain of field-effect transistor 202 and an output lead 207. In other embodiments, additional circuitry, such as matching circuitry can be arranged inside packaged transistor 200 in between the drain of field-effect transistor 202 and output lead 207 and/or in between the input lead 205 and the gate of field-effect transistor 202.

Leads 205, 207 are separated from substrate 203 using a dielectric separator. For example, a ceramic ring or solidified molding compound can be used to electrically isolate leads 205, 207 from substrate 203. Typically, leads 206, 207 and substrate 203 are fixedly connected to such dielectric separator.

It should be noted that the present invention is not limited to the packaging technology explained in conjunction with FIG. 5. Other packaging technologies, such as quad-flat no leads 'QFN' or dual-flat no leads 'DFN' type of packages may equally benefit from the transistor arrangement of the present invention.

The present invention is particularly advantageous when used for high power RF applications, such as RF power amplifiers. For example, the invention can be applied to Silicon based laterally diffused metal-oxide semiconductor 'LDMOS' transistor or Gallium Nitride based field-effect transistors 'FETs'. Such transistors may be configured to operate in a frequency range between 500 MHz and 100 GHz, and at high powers>10 W, such that phase delays associated with high finger lengths must be accounted for.

The present invention is not limited to field-effect transistors. Other transistor technologies in which input fingers and output fingers are used in a similar manner may also benefit from the invention.

Finally, it should be noted that the invention is not limited to the embodiments shown but that various modifications can be made to these embodiments without departing from the scope of the invention, which is limited by the appended claims and their equivalents.

The invention claimed is:
1. A field-effect transistor comprising a semiconductor substrate on which is arranged:
  at least one transistor cell array, each transistor cell array comprising a plurality of adjacently arranged interconnected transistor cells, each transistor cell comprising a first transistor cell unit, wherein each first transistor cell unit comprises:
    a plurality of gate fingers, a main gate finger segment, a plurality of drain fingers, and a main drain finger segment, wherein the plurality of gate fingers, the main gate finger segment, the plurality of drain fingers, and the main drain finger segment all extend in parallel;
    a main gate finger base connected to the main gate finger segment of that first transistor cell unit and extending from that main gate finger segment towards the main drain finger segment of that first transistor cell unit, the main gate finger base being connected to said plurality of gate fingers; and
    a main drain finger base connected to the main drain finger segment of that first transistor cell unit and extending from that main drain finger segment towards the main gate finger segment of that first transistor cell unit, the main drain finger base being connected to said plurality of drain fingers and being arranged spaced apart from and parallel to said main gate finger base, wherein the gate fingers extend from the main gate finger base towards the main drain finger base and the drain fingers extend from the main drain finger base towards the main gate finger base, wherein the gate fingers and the drain fingers are each fully arranged in a space between the main gate finger base and the main drain finger base, and wherein the main gate finger segments of adjacently arranged first transistor cell units are electrically connected to form a main gate finger, and wherein the main drain finger segments of adjacently arranged first transistor cell units are electrically connected to form a main drain finger;

a gate bar that is coupled to the main gate finger; and a drain bar that is coupled to the main drain finger, wherein all the gate fingers that are electrically connected to the gate bar extend in a same direction away from the main gate finger bases they are connected to, and wherein all the drain fingers that are electrically connected to the drain bar extend in a direction opposite to said same direction away from the main drain finger bases they are connected to.

2. The field-effect transistor according to claim 1, wherein the gate bar and the drain bar extend in parallel, and wherein the drain bar is spaced apart from the gate bar in a direction that corresponds to said same direction.

3. The field-effect transistor according to claim 2, wherein each transistor cell array of said at least one transistor cell array is arranged in between the gate bar and the drain bar.

4. The field-effect transistor according to claim 2, wherein the transistor cell comprises a second transistor cell unit, wherein the second transistor cell unit is a copy of the first transistor cell unit mirrored along the main gate finger segment of the first transistor cell unit, and wherein the first and second transistor cell units share the main gate finger segment; or wherein the transistor cell comprises a second transistor cell unit that is a copy of the first transistor cell unit mirrored along the main drain finger segment of the first transistor cell unit, and wherein the first and second cell units share the main drain finger segment.

5. The field-effect transistor according to claim 2, comprising a plurality of said transistor cell arrays.

6. The field-effect transistor according to claim 5, said plurality of transistor cell arrays comprising at least one pair of transistor cell arrays that share main gate finger segments or main drain finger segments.

7. The field-effect transistor according to claim 1, wherein one or more transistor cell arrays of said at least one transistor cell array comprise:

at least one first grounded shield arranged on the semiconductor substrate that is associated with a pair of adjacently arranged first transistor cell units and that is arranged in between the main drain finger base of one first transistor cell unit and the main gate finger base of the other first transistor cell unit.

8. The field-effect transistor according to claim 4, wherein one or more transistor cell arrays of said at least one transistor cell array comprise at least one second grounded shield arranged on the semiconductor substrate that is associated with a pair of adjacently arranged second transistor cell units and that is arranged in between the main drain finger base of one second transistor cell unit and the main gate finger base of the other second transistor cell unit.

9. The field-effect transistor according to claim 1, further comprising, for one or more transistor cell arrays of said at least one transistor cell array, at least one third grounded shield arranged on the semiconductor substrate between the drain bar and the main gate finger segment of the first transistor cell unit of a transistor cell in said one or more transistor cell arrays directly adjacent the drain bar or at least one fourth grounded shield arranged on the semiconductor substrate between the gate bar and the main drain finger segment of the first transistor cell unit of a transistor cell in said one or more transistor cell arrays directly adjacent the gate bar.

10. The field-effect transistor according to claim 8, further comprising, for one or more transistor cell arrays of said at least one transistor cell array, at least one fifth grounded shield arranged on the semiconductor substrate between the drain bar and the main gate finger segment of the second transistor cell unit of a transistor cell in said one or more transistor cell arrays directly adjacent the drain bar or at least one sixth grounded shield arranged on the semiconductor substrate between the gate bar and the main drain finger segment of the second transistor cell unit of a transistor cell in said one or more transistor cell arrays directly adjacent the gate bar.

11. The field-effect transistor according to claim 1, wherein each first transistor cell unit comprises a plurality of source fingers that extend in parallel to the plurality of gate fingers in said first transistor cell unit, each source finger being associated with a gate finger and a drain finger for the purpose of forming a transistor unit, and wherein the source finger extends in between the gate finger and drain finger it is associated with.

12. The field-effect transistor according to claim 1, wherein the main gate finger segment, the main drain finger segment, the main gate finger base, the main drain finger base, the plurality of gate fingers, and the plurality of drain fingers of each first transistor cell unit are each formed using one or more metals of a same metal layer stack.

13. The field-effect transistor according to claim 1, wherein:

the field-effect transistor is a laterally diffused metal-oxide-semiconductor (LDMOS) transistor or a high electron mobility transistor (HEMT);

a combined length of all the gate fingers exceeds 1 mm;

a combined length of all the drain fingers exceeds 1 mm; or an operational frequency of the field-effect transistor exceeds 500 MHz.

14. The field-effect transistor according to claim 13, wherein the field-effect transistor is a LDMOS transistor, and wherein the LDMOS transistor is a Silicon-based LDMOS transistor.

15. The field-effect transistor according to claim 13, wherein the field-effect transistor is a HEMT, and wherein the HEMT is a Gallium-Nitride-based HEMT.

16. A packaged field-effect transistor, comprising:

a conductive substrate;

the field-effect transistor according to claim 1 mounted on the conductive substrate;

a gate lead and a drain lead, both isolated from the conductive substrate by a dielectric separator;

one or more gate bondwires connecting the gate bar of the field-effect transistor either directly or indirectly to the gate lead; and one or more drain bondwires connecting the drain bar of the field-effect transistor either directly or indirectly to the drain lead.

17. An electronic device comprising the field-effect transistor according to claim 1.

18. The electronic device according to claim 17, wherein the electronic device is a base station for mobile telecommunications, a radar, or a solid-state cooking device.

19. An electronic device comprising the packaged field-effect transistor according to claim 14.

20. The electronic device according to claim 19, wherein the electronic device is a base station for mobile telecommunications, a radar, or a solid-state cooking device.

* * * * *